US010856404B2

(12) United States Patent
Yen et al.

(10) Patent No.: US 10,856,404 B2
(45) Date of Patent: Dec. 1, 2020

(54) SIGNAL PROCESSING CIRCUIT CAPABLE OF AVOIDING COOPERATING MEMORY CHIP FROM PERFORMANCE DEGRADATION

(71) Applicant: REALTEK SEMICONDUCTOR CORP., Hsinchu (TW)

(72) Inventors: Shou-Te Yen, Hsinchu County (TW); Chao-Min Lai, Hsinchu (TW); Ping-Chia Wang, Hsinchu (TW)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 0 days.

(21) Appl. No.: 16/740,950

(22) Filed: Jan. 13, 2020

(65) Prior Publication Data
US 2020/0253038 A1 Aug. 6, 2020

(30) Foreign Application Priority Data
Jan. 31, 2019 (TW) .............................. 108103906 A

(51) Int. Cl.
*H05K 1/11* (2006.01)
*H05K 1/18* (2006.01)
(Continued)

(52) U.S. Cl.
CPC ........... *H05K 1/0228* (2013.01); *H05K 1/116* (2013.01); *H05K 1/181* (2013.01); *H05K 2201/10159* (2013.01)

(58) Field of Classification Search
CPC .......... H05K 1/117; H05K 1/181; H05K 5/00; H05K 5/0043; H05K 5/0047;
(Continued)

(56) References Cited

U.S. PATENT DOCUMENTS 5,567,654 A * 10/1996 Beilstein, Jr. ..... H01L 23/49827
257/E21.705
7,023,719 B1 * 4/2006 Hung ....................... G11C 5/04
365/226
(Continued)

FOREIGN PATENT DOCUMENTS

TW          503464 B       9/2002

OTHER PUBLICATIONS

Taiwan Office Action for application No. 108103906 dated Jun. 28, 2019.

*Primary Examiner* — Xiaoliang Chen
(74) *Attorney, Agent, or Firm* — Birch, Stewart, Kolasch & Birch, LLP

(57) ABSTRACT

A signal processing circuit includes: a printed circuit board (PCB) including a first surface layer, a second surface layer, a first reference layer, and a second reference layer, wherein the first and second surface layers are positioned on opposing side of the PCB while the first reference layer and the second reference layer are positioned between the first and second surface layers; a memory chip positioned on the first surface layer; a controller chip positioned on the second surface layer; a first set of signal lines arranged on the first surface layer and coupled with the memory chip, wherein all signal lines in the first set of signal lines does not cross each other; and a second set of signal lines arranged on the second surface layer and coupled with the controller chip, wherein all signal lines in the second set of signal lines does not cross each other.

4 Claims, 6 Drawing Sheets

(51) Int. Cl.
*H05K 5/00* (2006.01)
*G11C 5/04* (2006.01)
*G11C 5/06* (2006.01)
*H05K 1/02* (2006.01)

(58) Field of Classification Search
CPC .......... H05K 5/0278; H05K 1/11; H05K 1/18; G11C 5/04; G11C 5/06; G11C 5/063
USPC ................. 174/260; 365/51, 63, 226, 233.1; 439/131, 607.22
See application file for complete search history.

(56) References Cited

U.S. PATENT DOCUMENTS

| | | | |
|---|---|---|---|
| 2001/0022739 A1* | 9/2001 | Funaba ................... | G11C 5/04 365/63 |
| 2007/0066102 A1* | 3/2007 | Takemoto .............. | H05K 1/117 439/131 |
| 2009/0098773 A1* | 4/2009 | Cheng ................ | H01R 13/7175 439/607.22 |
| 2015/0043298 A1* | 2/2015 | Hayashi ................ | G11C 5/063 365/233.1 |
| 2016/0351232 A1* | 12/2016 | Sugita ................ | G06F 16/9535 |
| 2017/0188473 A1* | 6/2017 | Suzuki ................ | H05K 5/0043 |

\* cited by examiner

SIGNAL PROCESSING CIRCUIT CAPABLE OF AVOIDING COOPERATING MEMORY CHIP FROM PERFORMANCE DEGRADATION

CROSS-REFERENCE TO RELATED APPLICATIONS

This application claims the benefit of priority to Patent Application No. 108103906, filed in Taiwan on Jan. 31, 2019; the entirety of which is incorporated herein by reference for all purposes.

BACKGROUND

The disclosure generally relates to a signal processing circuit and, more particularly, to a signal processing circuit capable of avoiding a cooperating memory chip from performance degradation.

Many signal processing circuits are provided with various high-speed memory chips. In many applications, there are a lot of signal lines existing between a memory chip and a controller chip in the signal processing circuit, therefore the signal line arrangement becomes extremely complicated. As well-known, unideal arrangement of the signal lines would result in crosstalk interference among signal lines, and it might also increase the length of the signal lines as well as the quantity of required vias, thereby causing inconsistent delay or phase mismatch among relevant signal lines.

In response to aforementioned situations, many memory chips would degrade their performance level during operations, and thus could not offer the theoretically optimal performance. As a result, it would adversely affect the overall performance of the signal processing circuit.

SUMMARY

In view of the foregoing, it may be appreciated that a substantial need exists for methods and apparatuses that mitigate or reduce the problems above.

An example embodiment of a signal processing circuit is disclosed, comprising: a printed circuit board, comprising a first surface layer, a second surface layer, a first reference layer, and a second reference layer, wherein the first surface layer and the second surface layer are respectively positioned on opposing sides of the printed circuit board, while the first reference layer and the second reference layer are positioned between the first surface layer and the second surface layer; a memory chip, positioned on the first surface layer; a controller chip, positioned on the second surface layer; a first set of signal lines, arranged on the first surface layer, and coupled with the memory chip, while all signal lines in the first set of signal lines do not cross each other; and a second set of signal lines, arranged on the second surface layer, and coupled with the controller chip, while all signal lines in the second set of signal lines do not cross each other; wherein the controller chip is coupled with the memory chip through the first set of signal lines, the second set of signal lines, and multiple vias penetrating through the printed circuit board; at least a portion of signal assignments of the memory chip are arranged symmetrically with respect to a central axis of the memory chip; while at least a portion of signal assignments of the controller chip are arranged symmetrically with respect to a central axis of the controller chip.

Both the foregoing general description and the following detailed description are examples and explanatory only, and are not restrictive of the invention as claimed.

DETAILED DESCRIPTION

Reference is made in detail to embodiments of the invention, which are illustrated in the accompanying drawings. The same reference numbers may be used throughout the drawings to refer to the same or like parts, components, or operations.

Figure 1:
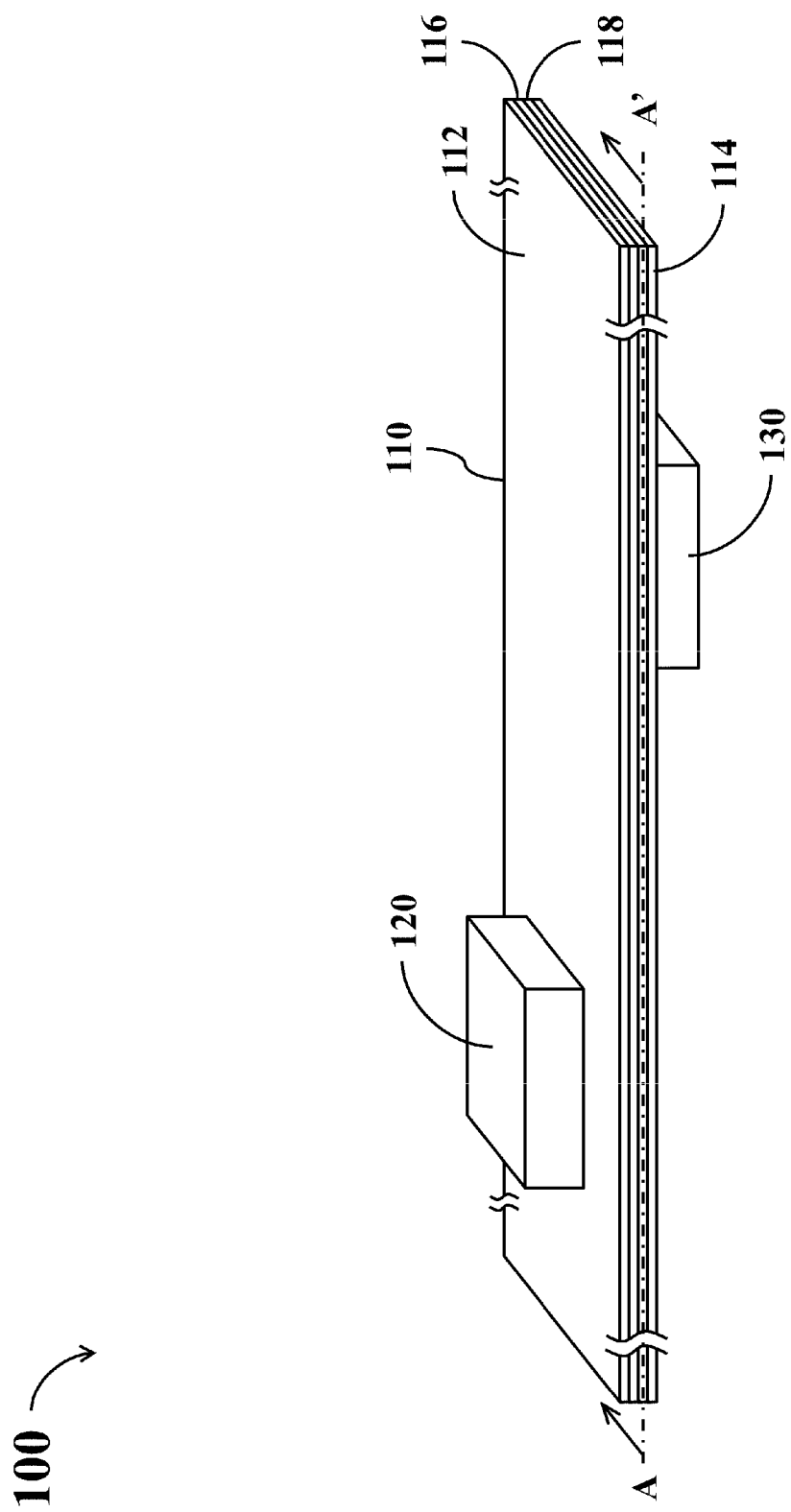
FIG. 1 shows a simplified structural diagram of a signal processing circuit according to one embodiment of the present disclosure.
Figure 2:
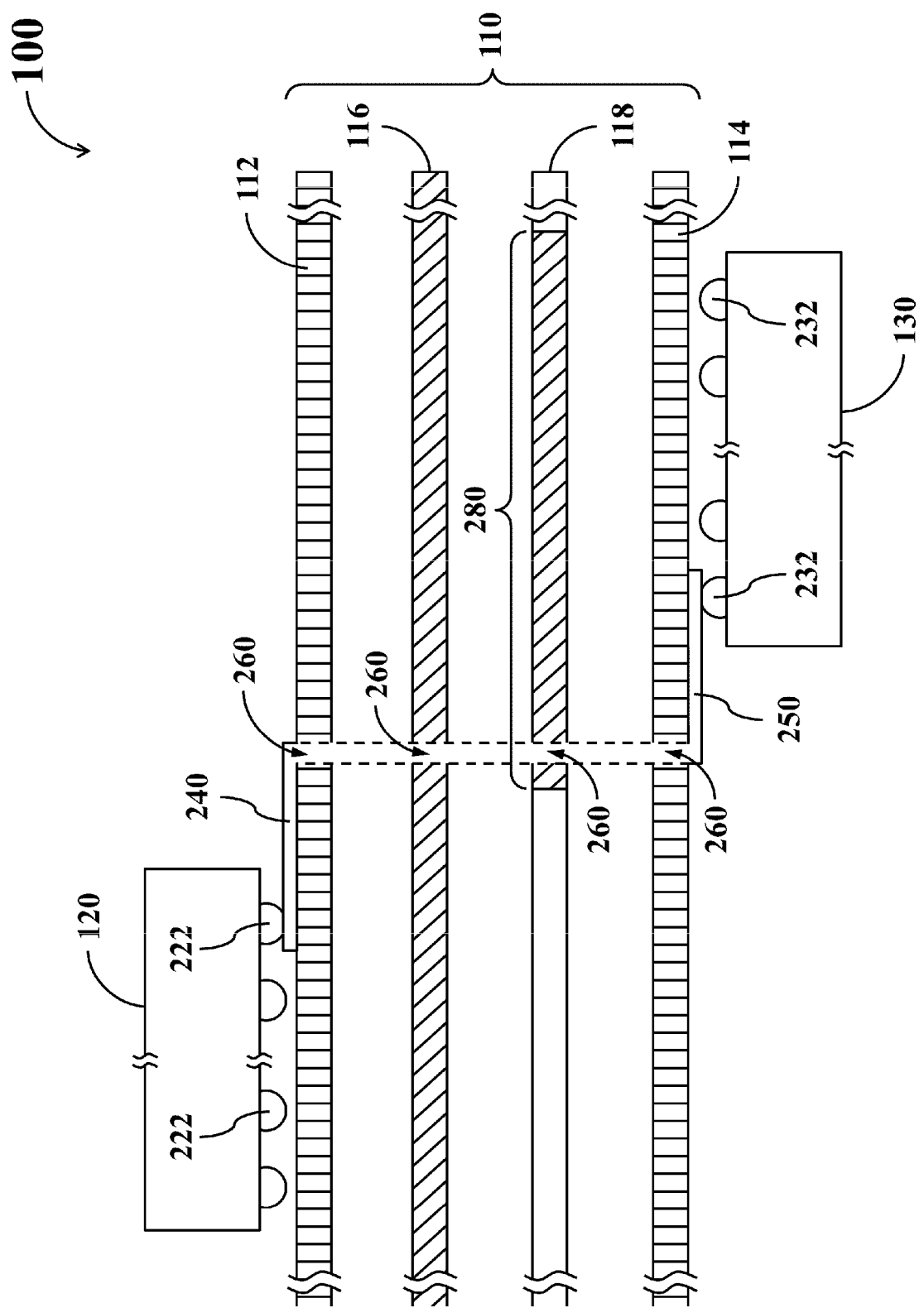
FIG. 2 shows a schematic cross-sectional diagram of the signal processing circuit of FIG. 1 along the direction A-A'.
Figure 3:
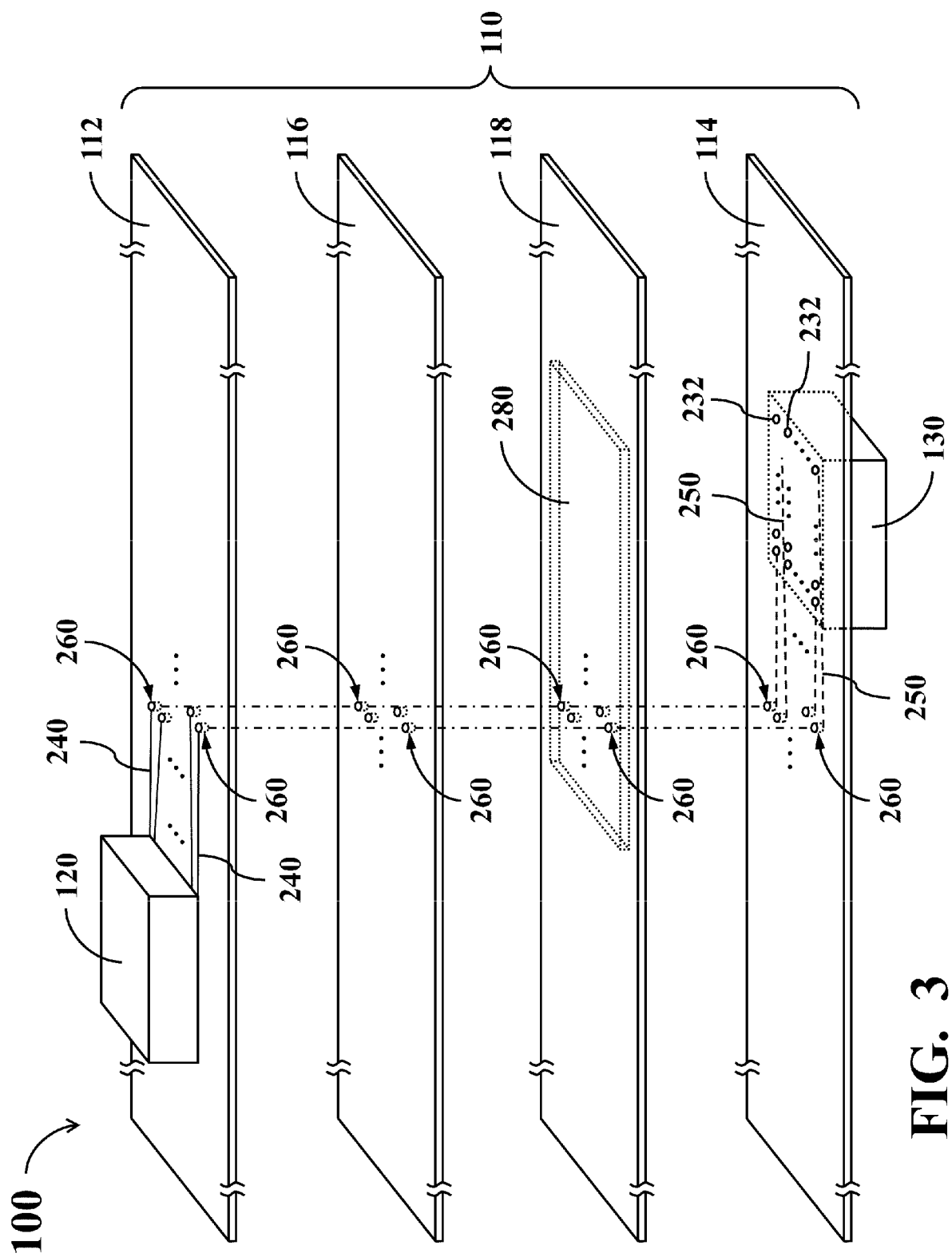
FIG. 3 shows a schematic decomposed diagram of the signal processing circuit of FIG. 1.

Please refer to FIG. 1 through FIG. 3. FIG. 1 shows a simplified structural diagram of a signal processing circuit 100 according to one embodiment of the present disclosure. FIG. 2 shows a schematic cross-sectional diagram of the signal processing circuit 100 along the direction A-A'. FIG. 3 shows a schematic decomposed diagram of the signal processing circuit 100.

The signal processing circuit 100 comprises a printed circuit board (PCB) 110, a memory chip 120, and a controller chip 130. The PCB 110 is a multilayer circuit board having at least four-layer structures. In this embodiment, the PCB 110 comprises a first surface layer 112, a second surface layer 114, a first reference layer 116, and a second reference layer 118. The first surface layer 112 and the second surface layer 114 are respectively positioned on opposing sides of the PCB 110, while the first reference layer 116 and the second reference layer 118 are positioned between the first surface layer 112 and the second surface layer 114.

The memory chip 120 is positioned on the first surface layer 112, and arranged to operably store data required for operations of the signal processing circuit 100, or the data generated by the controller chip 130. The controller chip 130 is positioned on the second surface layer 114, and arranged to operably access the memory chip 120 and to operably control operations of the signal processing circuit 100. In other words, the memory chip 120 and the controller chip 130 are respectively positioned on opposing sides of the PCB 110.

In practice, the PCB 110 may be realized with a multilayer circuit board of various appropriate materials. In addition, each of the memory chip 120 and the controller chip 130 may be packaged by utilizing various appropriate packaging structures, such as a BGA (ball grid array) package, a mBGA (micro ball grid array) package, or the like.

The structure and the signal line arrangement of the signal processing circuit 100 will be further described below by reference to FIG. 2 and FIG. 3.

As shown in FIG. 2 and FIG. 3, the package of the memory chip 120 comprises multiple solder balls 222, while the package of the controller chip 130 comprises multiple solder balls 232. The arrangement of the solder balls 222 on the memory chip 120 corresponds to the signal assignment of the memory chip 120. Similarly, the arrangement of the solder balls 232 on the controller chip 130 corresponds to the signal assignment of the controller chip 130.

In addition, the signal processing circuit 100 further comprises a first set of signal lines 240 and a second set of signal lines 250. The first set of signal lines 240 are arranged on the first surface layer 112, and coupled with the memory chip 120. The second set of signal lines 250 are arranged on the second surface layer 114, and coupled with the controller chip 130. In order to simplify the drawings, FIG. 2 shows only one of the signal lines in the first set of signal lines 240 and one of the signal lines in the second set of signal lines 250 for exemplification.

The controller chip 130 may be coupled with the memory chip 120 through the first set of signal lines 240, the second set of signal lines 250, and multiple vias penetrating the PCB 110 so as to access the memory chip 120.

In practical applications, other active components, passive components, relevant circuits and/or chips may be further arranged on the PCB 110, but in order to simplify the drawings, these components are not shown in FIG. 1 through FIG. 3.

In the signal processing circuit 100, the controller chip 130 and the memory chip 120 may be arranged such that the central axis of the controller chip 130 is aligned with the central axis of the memory chip 120 or parallel with the central axis of the memory chip 120, so that the signal lines coupling between the controller chip 130 and the memory chip 120 do not need to cross each other, which is beneficial in reducing the complexity of the signal line arrangement. That is, by adopting the aforementioned chip arrangement, all signal lines in the first set of signal lines 240 do not cross each other, while all signal lines in the second set of signal lines 250 do not cross each other.

The aforementioned arrangement of the controller chip 130 and the memory chip 120 is beneficial in reducing or preventing the signal lines from crossing each other, thereby reducing the probability for the occurrence of crosstalk interference among signal lines.

Since the signal lines between the controller chip 130 and the memory chip 120 do not need to cross each other, the first set of signal lines 240 and the second set of signal lines 250 may be electrically connected through vias penetrating the PCB 110. For example, as shown in FIG. 2, any specific signal line 240 in the first set of signal lines 240 may be electrically connected with a corresponding signal line 250 in the second set of signal lines 250 through multiple vias 260 which are vertically aligned. Such vias arrangement not only a simple approach but also renders that all signal lines pass through a same quantity of vias. In this embodiment, for example, the quantity of vias being coupled with respective signal lines in the first set of signal lines 240 is four, which is the same as the quantity of vias being coupled with respective signal lines in the second set of signal lines 250.

The aforementioned approach of vias arrangement can effectively control the length of the relevant signal lines so as to mitigate or prevent inconsistent delay or phase mismatch among relevant signal lines.

In the embodiment of FIG. 1 through FIG. 3, the first reference layer 116 is adjacent to the first surface layer 112, while the second reference layer 118 is adjacent to the second surface layer 114. As shown in FIG. 2 and FIG. 3, a characteristic-swapped region 280 is arranged in the partial area of the second reference layer 118, while the characteristic-swapped region 280 covers the projection region projected by the second set of signal lines 250 on the second reference layer 118. In the signal processing circuit 100, the electrical characteristic of the first reference layer 116 is opposite to the electrical characteristic of the second reference layer 118, while the electrical characteristic of the characteristic-swapped region 280 on the second reference layer 118 is the same as the electrical characteristic of the first reference layer 116.

For example, the first reference layer 116 may be arranged to be the ground layer, the second reference layer 118 may be arranged to be the power layer, while the characteristic-swapped region 280 may be arranged to be a ground region. As a result, the reference layer corresponding to the first set of signal lines 240 on the first surface layer 112, that is, the projection area projected by the first set of signal lines 240 on the first reference layer 116 (which is part of the ground layer in this example), has the same characteristic as the reference layer corresponding to the second set of signal lines 250 on the second surface layer 114 (i.e., the characteristic-swapped region 280).

For another example, the first reference layer 116 may be arranged to be the power layer, the second reference layer 118 may be arranged to be the ground layer, while the characteristic-swapped region 280 may be arranged to be a power region. As a result, the reference layer corresponding to the first set of signal lines 240 on the first surface layer 112, that is, the projection area projected by the first set of signal lines 240 on the first reference layer 116 (which is part of the power layer in this example), has the same characteristic as the reference layer corresponding to the second set of signal lines 250 on the second surface layer 114 (i.e., the characteristic-swapped region 280).

In practice, the surrounding of the characteristic-swapped region 280 may be arranged with insulating materials to prevent the characteristic-swapped region 280 from directly touching other areas of the second reference layer 118 and subsequently lead to short circuit. The aforementioned approach of arranging the characteristic-swapped region 280 in the partial area of the second reference layer 118 prevents the signal quality and/or signal accuracy between the memory chip 120 and the controller chip 130 from being adversely affected by the characteristic variation of the reference layers along the path of the signal lines.

As can be appreciated from the foregoing descriptions that it can reduce or eliminate signal crosstalk interference and also mitigate or eliminate inconsistent delay and/or phase mismatch among signals by adopting the disclosed arrangement and relative position of the memory chip 120 and the controller chip 130 of the signal processing circuit 100, the vias arrangement of the signal lines, and arranging the characteristic-swapped region 280 in the partial area of the second reference layer 118. In addition, it can also prevent the signal quality and/or signal accuracy from degrading due to the difference in terms of the characteristic of the reference layers of the signals.

As a result, the probability that the memory chip 120 degrades its performance level during operations when encountering the aforementioned problems can be effectively reduced or avoided. In other words, by adopting the aforementioned circuit structure design, the possibility that the memory chip 120 operates at its theoretically optimal performance level can be effectively increased, thereby improving the overall operation performance of the signal processing circuit 100.

Please note that the aforementioned relative position of the first reference layer 116 and the second reference layer 118 is merely an exemplary embodiment, rather than a restriction to the practical implementations. In practice, the positions of the aforementioned first reference layer 116 and second reference layer 118 may be swapped.

Figure 4:
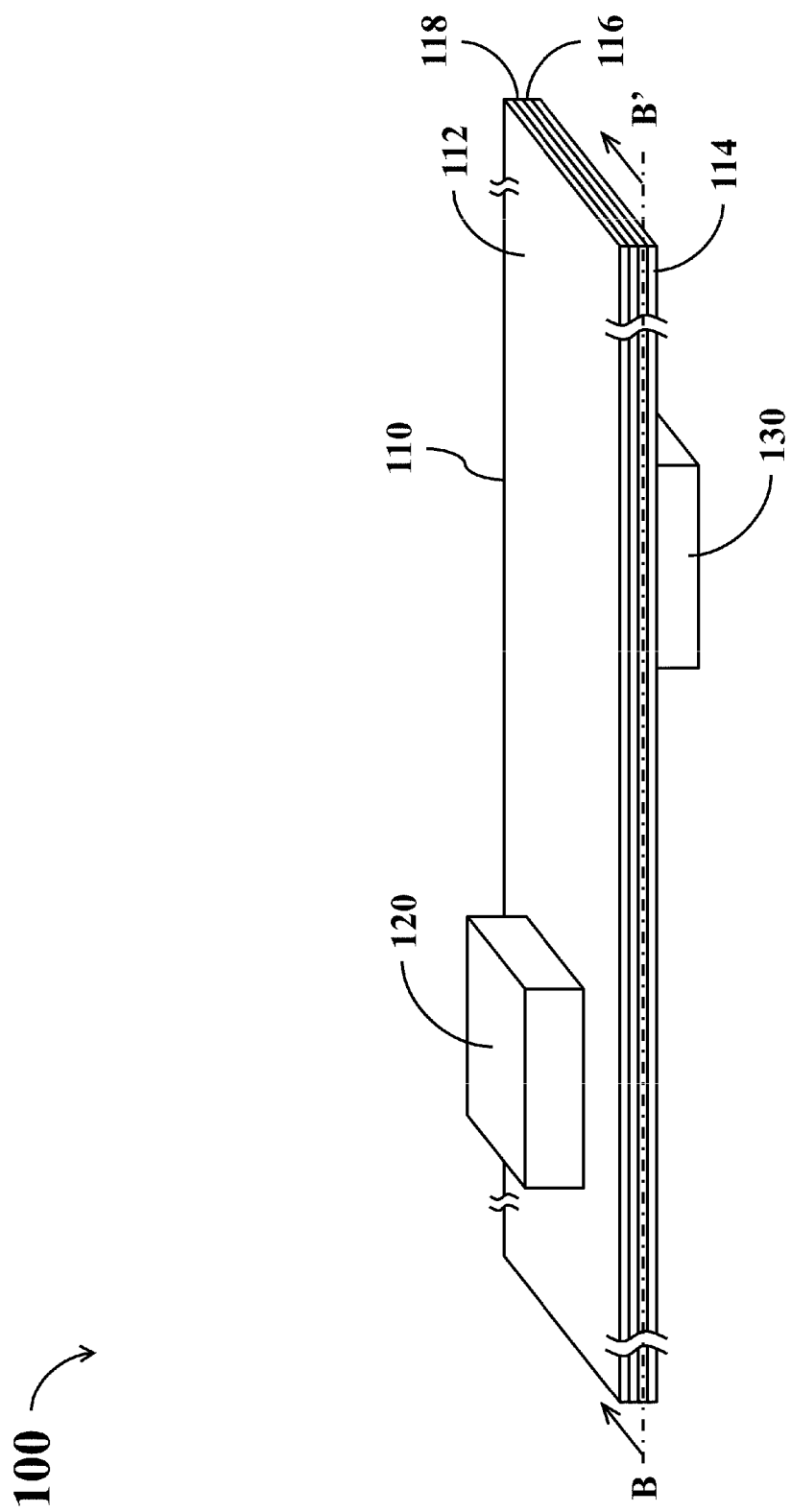
FIG. 4 shows a simplified structural diagram of the signal processing circuit according to another embodiment of the present disclosure.
Figure 5:
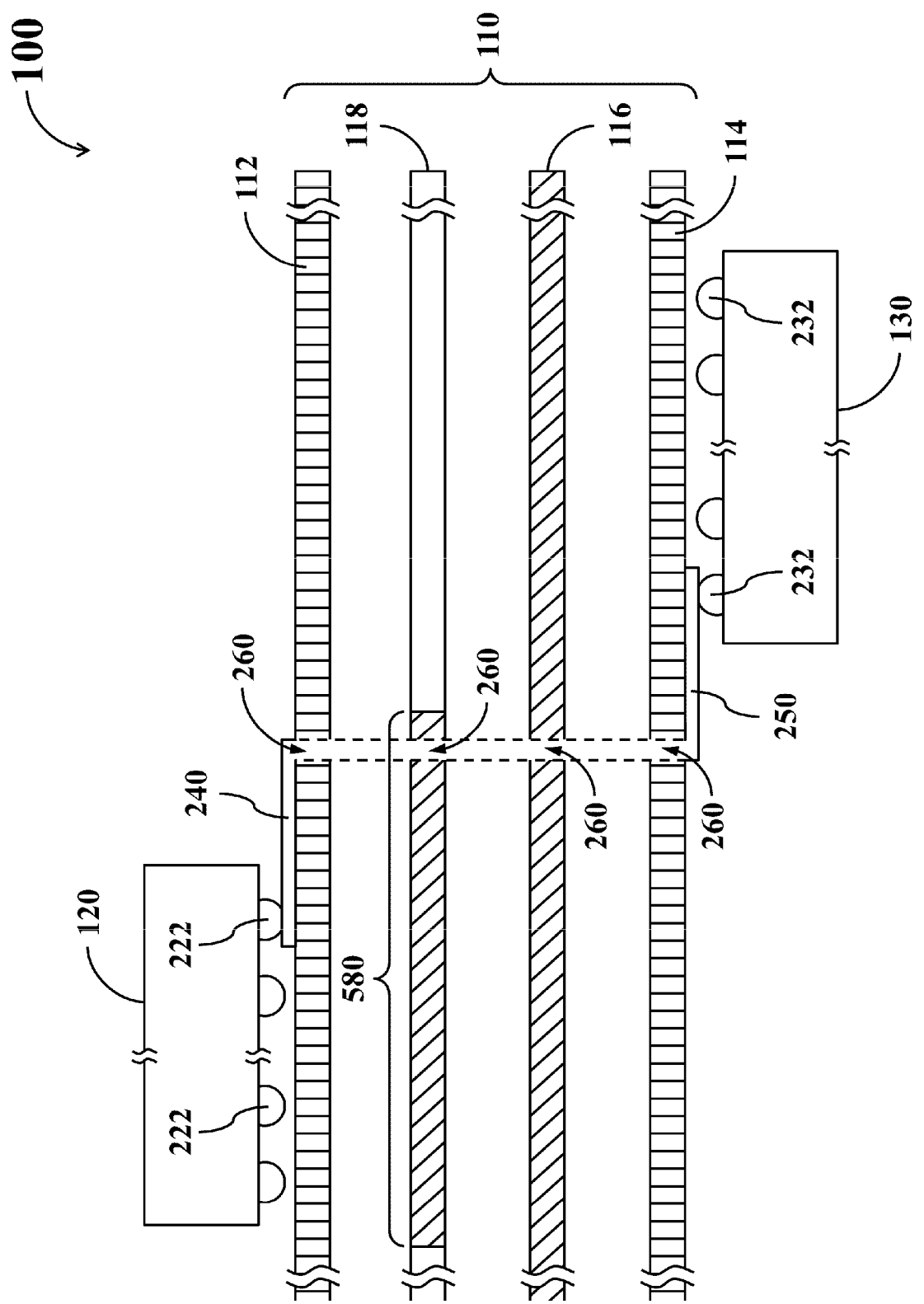
FIG. 5 shows a schematic cross-sectional diagram of the signal processing circuit of FIG. 4 along the direction B-B'.
Figure 6:
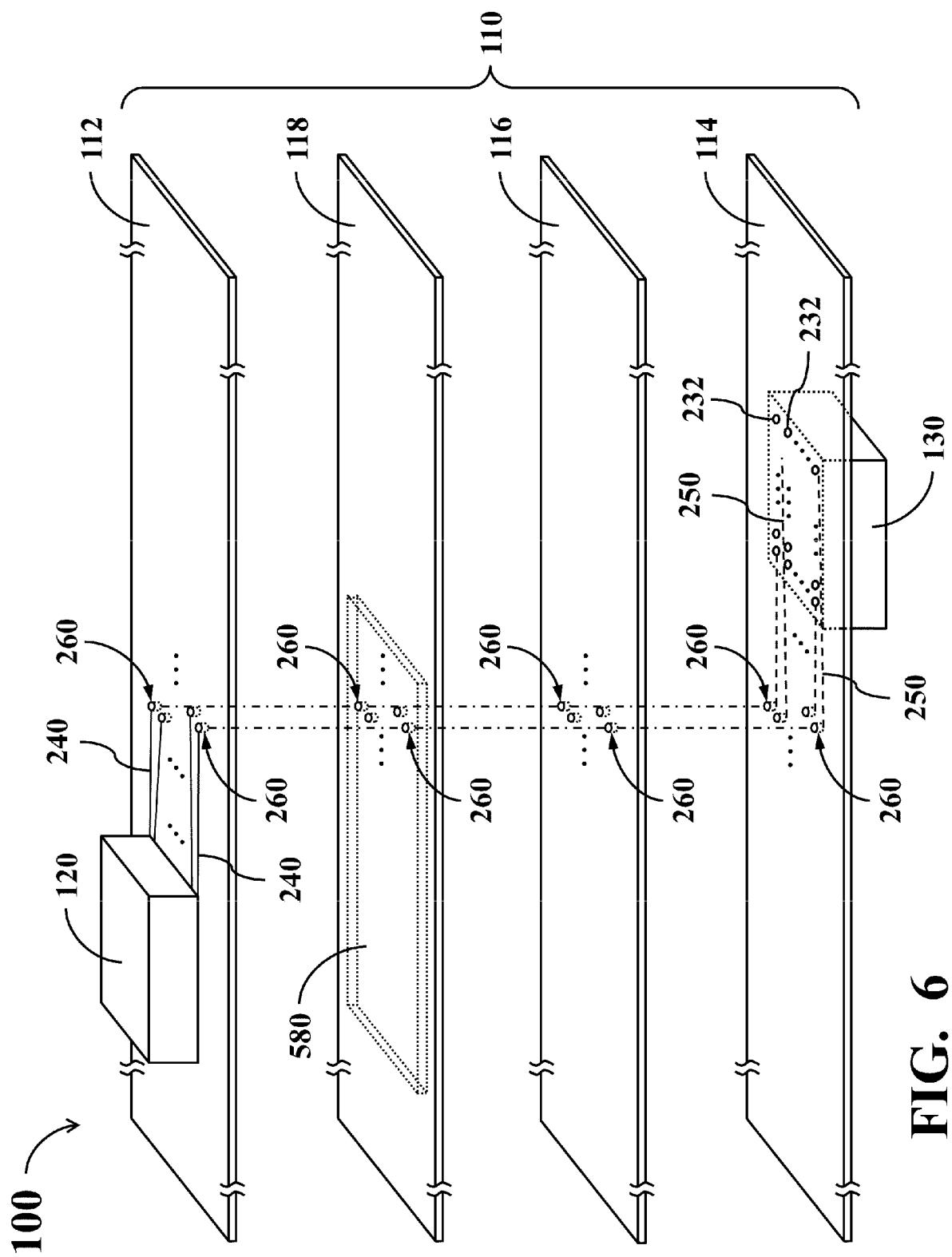
FIG. 6 shows a schematic decomposed diagram of the signal processing circuit of FIG. 4.

For example, please refer to FIG. 4 through FIG. 6. FIG. 4 shows a simplified structural diagram of the signal processing circuit 100 according to another embodiment of the present disclosure. FIG. 5 shows a schematic cross-sectional diagram of the signal processing circuit 100 of FIG. 4 along the direction B-B'. FIG. 6 shows a schematic decomposed diagram of the signal processing circuit 100 of FIG. 4.

In the embodiments of FIG. 4 through FIG. 6, the first reference layer 116 is adjacent to the second surface layer 114, while the second reference layer 118 is adjacent to the first surface layer 112. As shown in FIG. 5 and FIG. 6, a characteristic-swapped region 580 is arranged in the partial area of the second reference layer 118 in this embodiment, while the characteristic-swapped region 580 covers the projection region projected by the first set of signal lines 240 on the second reference layer 118. The electrical characteristic of the characteristic-swapped region 580 on the second reference layer 118 is the same as the electrical characteristic of the first reference layer 116.

For example, the first reference layer 116 may be arranged to be the ground layer, the second reference layer 118 may be arranged to be the power layer, while the characteristic-swapped region 580 may be arranged to be a ground region. As a result, the reference layer corresponding to the second set of signal lines 250 on the second surface layer 114, that is, the projection area projected by the second set of signal lines 250 on the first reference layer 116 (which is part of the ground layer in this example), has the same characteristic as the reference layer corresponding to the first set of signal lines 240 on the first surface layer 112 (i.e., the characteristic-swapped region 580).

For another example, the first reference layer 116 may be arranged to be the power layer, the second reference layer 118 may be arranged to be the ground layer, while the characteristic-swapped region 280 may be arranged to be a power region. As a result, the reference layer corresponding to the second set of signal lines 250 on the second surface layer 114, that is, the projection area of the second set of signal lines 250 on the first reference layer 116 (which is part of the power layer in this example), has the same characteristic as the reference layer corresponding to the first set of signal lines 240 on the first surface layer 112 (i.e., the characteristic-swapped region 580).

Similarly, the surrounding of the characteristic-swapped region 580 may be arranged with insulating materials to prevent the characteristic-swapped region 580 from directly touching other areas of the second reference layer 118 and subsequently lead to short circuit. The aforementioned approach of arranging the characteristic-swapped region 580 in the partial area of the second reference layer 118 prevents the signal quality and/or signal accuracy between the memory chip 120 and the controller chip 130 from being adversely affected by the characteristic variation of the reference layers along the path of the signal lines.

The foregoing descriptions regarding the implementations, connections, operations, and related advantages of other components in the embodiments of FIG. 1 through FIG. 3 are also applicable to the embodiments of FIG. 4 through FIG. 6. For the sake of brevity, those descriptions will not be repeated here.

In addition, in some embodiments, the vias arrangement of some signal lines whose signal delay or phase mismatch would not result in influence can be modified to be different from the vias arrangement of other signal lines, so as to increase the flexibility in the layout arrangement of the signal lines. In this situation, the quantity of vias coupled with these signal lines may be different from the quantity of vias being coupled with other signal lines. In general, under the aforementioned principle of vias arrangement, at least 50% of signal lines in the first set of signal lines 240 are coupled with the same quantity of vias, while at least 50% of signal lines in the second set of signal lines 250 are coupled with the same quantity of vias.

In practice, other ground layers, power layers, and/or signal layers may be arranged between the first reference layer 116 and the second reference layer 118 of the aforementioned embodiments in FIG. 1 through FIG. 6 when necessary. In other words, the aforementioned PCB 110 may be realized with a circuit board having more layer structures.

Certain terms are used throughout the description and the claims to refer to particular components. One skilled in the art appreciates that a component may be referred to as different names. This disclosure does not intend to distinguish between components that differ in name but not in function. In the description and in the claims, the term "comprise" is used in an open-ended fashion, and thus should be interpreted to mean "include, but not limited to." The term "couple" is intended to compass any indirect or direct connection. Accordingly, if this disclosure mentioned that a first device is coupled with a second device, it means that the first device may be directly connected to the second device or indirectly connected to the second device with other intermediate devices or connection means.

The term "and/or" may comprise any and all combinations of one or more of the associated listed items. In addition, the singular forms "a," "an," and "the" herein are intended to comprise the plural forms as well, unless the context clearly indicates otherwise.

Throughout the description and claims, the term "element" contains the concept of component, layer, or region.

In the drawings, the size and relative sizes of some elements may be exaggerated or simplified for clarity. Accordingly, unless the context clearly specifies, the shape, size, relative size, and relative position of each element in the drawings are illustrated merely for clarity, and not intended to be used to restrict the claim scope.

For the purpose of explanatory convenience in the specification, spatially relative terms, such as "on," "above," "below," "beneath," "higher," "lower," "upward," "downward," and the like, may be used herein to describe the function of a particular element or to describe the relationship of one element to another element(s) as illustrated in the drawings. It will be understood that the spatially relative terms are intended to encompass different orientations of the element in use, in operations, or in assembly in addition to the orientation depicted in the drawings. For example, if the element in the drawings is turned over, elements described as "on" or "above" other elements would then be oriented "under" or "beneath" the other elements. Thus, the exemplary term "beneath" can encompass both an orientation of above and beneath.

Throughout the description and claims, it will be understood that when a component is referred to as being "positioned on," "positioned above," "connected to," "engaged with," or "coupled with" another component, it can be directly on, directly connected to, or directly engaged with the other component, or intervening component may be present. In contrast, when a component is referred to as being "directly on," "directly connected to," or "directly engaged with" another component, there are no intervening components present.

Other embodiments of the invention will be apparent to those skilled in the art from consideration of the specification and practice of the invention disclosed herein. It is intended that the specification and examples be considered as exemplary only, with a true scope and spirit of the invention indicated by the following claims.

What is claimed is:

1. A signal processing circuit (100), comprising:
a printed circuit board (110), comprising a first surface layer (112), a second surface layer (114), a first reference layer (116), and a second reference layer (118), wherein the first surface layer (112) and the second surface layer (114) are respectively positioned on opposing sides of the printed circuit board (110), while the first reference layer (116) and the second reference layer (118) are positioned between the first surface layer (112) and the second surface layer (114);
a memory chip (120), positioned on the first surface layer (112);
a controller chip (130), positioned on the second surface layer (114);
a first set of signal lines (240), arranged on the first surface layer (112), and coupled with the memory chip (120), while all signal lines in the first set of signal lines (240) do not cross each other; and
a second set of signal lines (250), arranged on the second surface layer (114), and coupled with the controller chip (130), while all signal lines in the second set of signal lines (250) do not cross each other;
wherein the controller chip (130) is coupled with the memory chip (120) through the first set of signal lines (240), the second set of signal lines (250), and multiple vias (260) penetrating through the printed circuit board (110); at least a portion of signal assignments of the memory chip (120) are arranged symmetrically with respect to a central axis of the memory chip (120); while at least a portion of signal assignments of the controller chip (130) are arranged symmetrically with respect to a central axis of the controller chip (130);
wherein the first reference layer (116) is adjacent to the first surface layer (112), the second reference layer (118) is adjacent to the second surface layer (114), a characteristic-swapped region (280) is arranged in partial area of the second reference layer (118), while the characteristic-swapped region (280) covers a projection region projected by the second set of signal lines (250) on the second reference layer (118);
wherein an electrical characteristic of the first reference layer (116) is opposite to an electrical characteristic of the second reference layer (118), while an electrical characteristic of the characteristic-swapped region (280) is the same as the electrical characteristic of the first reference layer (116).

2. The signal processing circuit (100) of claim 1, wherein at least 50% of signal lines in the first set of signal lines (240) are coupled with a same quantity of vias, while at least 50% of signal lines in the second set of signal lines (250) are coupled with a same quantity of vias.

3. A signal processing circuit (100), comprising
a printed circuit board (110), comprising a first surface layer (112), a second surface layer (114), a first reference layer (116), and a second reference layer (118), wherein the first surface layer (112) and the second surface layer (114) are respectively positioned on opposing sides of the printed circuit board (110), while the first reference layer (116) and the second reference layer (118) are positioned between the first surface layer (112) and the second surface layer (114);
a memory chip (120), positioned on the first surface layer (112);
a controller chip (130), positioned on the second surface layer (114);
a first set of signal lines (240), arranged on the first surface layer (112), and coupled with the memory chip (120), while all signal lines in the first set of signal lines (240) do not cross each other; and
a second set of signal lines (250), arranged on the second surface layer (114), and coupled with the controller chip (130), while all signal lines in the second set of signal lines (250) do not cross each other;
wherein the controller chip (130) is coupled with the memory chip (120) through the first set of signal lines (240), the second set of signal lines (250), and multiple vias (260) penetrating through the printed circuit board (110); at least a portion of signal assignments of the memory chip (120) are arranged symmetrically with respect to a central axis of the memory chip (120); while at least a portion of signal assignments of the controller chip (130) are arranged symmetrically with respect to a central axis of the controller chip (130);
wherein the first reference layer (116) is adjacent to the second surface layer (114), the second reference layer (118) is adjacent to the first surface layer (112), a characteristic-swapped region (580) is arranged in partial area of the second reference layer (118), while the characteristic-swapped region (580) covers a projection region projected by the first set of signal lines (240) on the second reference layer (118);
wherein an electrical characteristic of the first reference layer (116) is opposite to an electrical characteristic of the second reference layer (118), while an electrical characteristic of the characteristic-swapped region (580) is the same as the electrical characteristic of the first reference layer (116).

4. The signal processing circuit (100) of claim 3, wherein at least 50% of signal lines in the first set of signal lines (240) are coupled with a same quantity of vias, while at least 50% of signal lines in the second set of signal lines (250) are coupled with a same quantity of vias.

* * * * *